(12) United States Patent
Sasaki et al.

(10) Patent No.: US 7,713,070 B2
(45) Date of Patent: May 11, 2010

(54) ELECTRIC CONNECTION BOX

(75) Inventors: Yoshikazu Sasaki, Yokkaichi (JP);
Yukinori Kita, Yokkaichi (JP)

(73) Assignees: Autonetwork Technologies, Ltd., Mie
(JP); Sumitomo Wiring Systems, Ltd.,
Mie (JP); **Sumitomo Electric
Industries, Ltd.**, Osaka (JP)

( * ) Notice: Subject to any disclaimer, the term of this patent is extended or adjusted under 35 U.S.C. 154(b) by 402 days.

(21) Appl. No.: 11/887,578

(22) PCT Filed: Mar. 31, 2006

(86) PCT No.: PCT/JP2006/306879

§ 371 (c)(1),
(2), (4) Date: Oct. 9, 2007

(87) PCT Pub. No.: WO2006/109597

PCT Pub. Date: Oct. 19, 2006

(65) Prior Publication Data

US 2009/0298309 A1    Dec. 3, 2009

(30) Foreign Application Priority Data

Apr. 11, 2005   (JP)   ............................ 2005-113124

(51) Int. Cl.
*H01R 1/00* (2006.01)
(52) U.S. Cl. ...................... 439/76.1; 361/736
(58) Field of Classification Search ................ 439/76.1, 439/79, 76.2, 595, 599, 737; 361/736, 752
See application file for complete search history.

(56) References Cited

U.S. PATENT DOCUMENTS

| | | | |
|---|---|---|---|
| 5,253,142 A * | 10/1993 | Weng | ................... 361/679.56 |
| 5,967,830 A | 10/1999 | Tsuji | |
| 7,364,438 B2 * | 4/2008 | Sasaki et al. | ............... 439/76.1 |
| 2003/0137813 A1 | 7/2003 | Onizuka et al. | |
| 2005/0059298 A1 * | 3/2005 | Lin et al. | ..................... 439/607 |
| 2005/0094356 A1 * | 5/2005 | Onizuka et al. | ............. 361/611 |
| 2006/0030213 A1 * | 2/2006 | Kawakita et al. | ............ 439/607 |
| 2006/0067058 A1 * | 3/2006 | Kita | ........................... 361/710 |
| 2009/0137135 A1 * | 5/2009 | Yamaguchi et al. | ........ 439/76.1 |
| 2009/0156024 A1 * | 6/2009 | Chung | ...................... 439/76.1 |

(Continued)

FOREIGN PATENT DOCUMENTS

EP    0 818 855 A1    1/1998

(Continued)

*Primary Examiner*—Neil Abrams
*Assistant Examiner*—Phuong Nguyen
(74) *Attorney, Agent, or Firm*—Oliff & Berridge, PLC

(57) ABSTRACT

A circuit structure 10 includes a circuit board 11 for mounting switching devices 13 and bus bars 12 wired into the circuit along the circuit board 11, and the case 20 includes a frame 21 that is disposed and secured in position around a perimeter edge of the circuit board 11 and a cover 24 that is assembled to the frame 21 so as to cover the circuit board 11. The frame 21 contains a second connector housing, and the second connector housing includes an hood 26a for accommodating the second terminals 15 formed at the ends of the bus bars 12. A deformation restricting portion 32 formed on the cover 24 is configured to abut the upper wall portion 26c (the outer face) of the hood 26a, thereby deformation of the hood 26a is restricted.

8 Claims, 4 Drawing Sheets

U.S. PATENT DOCUMENTS

2009/0163053 A1* 6/2009 Yamaguchi et al. ........ 439/76.1

FOREIGN PATENT DOCUMENTS

| JP | A 10-027646 | 1/1998 |
| JP | A 10-035375 | 2/1998 |
| JP | A-10-255874 | 9/1998 |
| JP | A 11-027829 | 1/1999 |
| JP | A 2003-164039 | 6/2003 |
| JP | A-2005-039881 | 2/2005 |
| WO | WO 2005/028259 A1 | 3/2005 |

* cited by examiner

ELECTRIC CONNECTION BOX

FIELD OF THE INVENTION

The present invention relates to an electric connection box having a structure in which a circuit assembly is accommodated in a case.

BACKGROUND ART

One example of a conventional electric connection box mounted in an automobile has a structure in which a circuit assembly is accommodated in a case. The circuit assembly includes a circuit board, bus bars wired into the circuit along the reverse face of the circuit board, and switching devices such as relays and the like that are mounted on the obverse face of the circuit board, while the bus bars are formed with terminals by bending the end thereof into substantially L-shape. The case includes a frame that is secured in position around a perimeter edge of the circuit board, and a cover that is mounted on the frame so as to cover the circuit board. Connector housings are mounted on the frame, and bus bar terminals are accommodated in hoods of the connector housing. When harness side connectors are fitted into the hoods, harness side connector terminals connect the bus bar terminals. An example of such an electric connection box is disclosed in Japanese Patent Application Publication No. JP-2003-164039 A.

Where an electric connection box as described above is mounted in an automobile, a cabling path of an electric wire to be connected with the electric connection box may require the electric wire to be severely bent right where it is exposed from the harness side connector. For example, where an electric connection box is accommodated in another and larger box and then mounted in an automobile, this type of cabling path easily occurs. Where the wire is severely bent right near the connector, the harness side connector tends to incline in the hood, and as a result, deformation of the wall defining the hood is of concern.

Thus, there is a need in the art for an electrical connection box able to prevent or minimize deformation of hood of a connector housing.

SUMMARY OF THE INVENTION

One aspect of the present invention includes an electric connection box including a circuit structure having a circuit board, the circuit board having a switching device mounted thereon and a bus bar layered on the circuit board, a case for accommodating the circuit structure, the case having a frame that is disposed and secured in position around the perimeter edge of the circuit board and cover that is assembled to the frame so as to cover the circuit board, a terminal positioned at the ends of the bus bars, a connector housing mounted on the frame and having a hood for accommodating the terminal, and a deformation restricting portion.

According to this structure, the hoods of the connector housing fit the mating connectors, and the wires of the connectors are connected with bus bars of the circuit structure. Where a force from the wire is applied on the connector on a direction to incline it or press into it by, for example, the wires being severely bent right near the connector from which the wires exposes, the force is received by the hoods of the connector housings and thus its deformation is a concern. However, since the outside of the hood abuts the deformation restricting portions formed on the cover, the hoods are prevented from deformation.

According to the present invention, deformation of the hoods is able to be prevented even where the force from the wires via the connector fitted into the hoods sets thereon.

BRIEF EXPLANATION OF THE SYMBOLS

Figure 1:
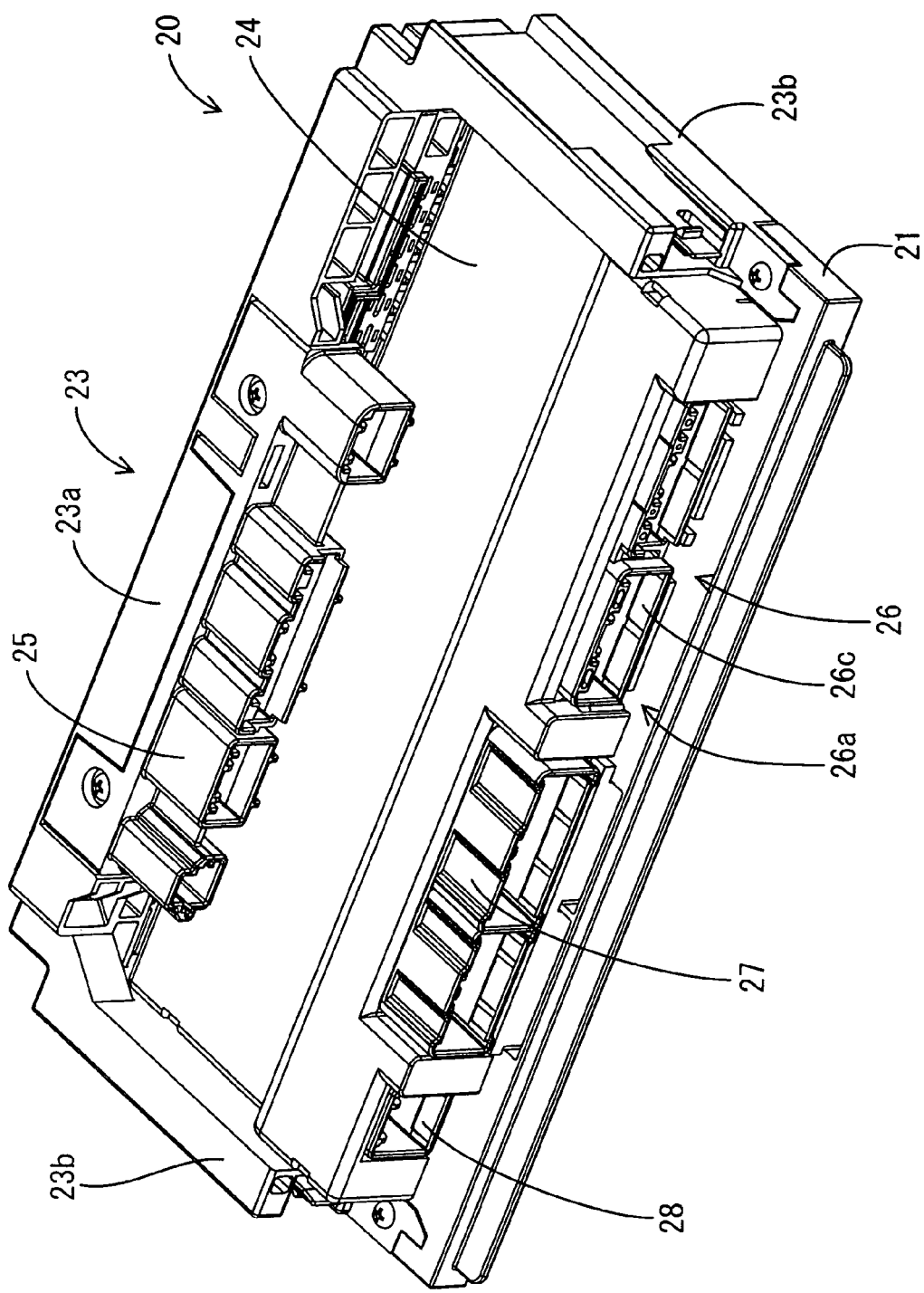
FIG. 1 is a perspective view of the outside of an electric connection box.

10 . . . a circuit structure
11 . . . a circuit board
12 . . . a bus bar
13 . . . a switching device
15 . . . a second terminal (a terminal)
20 . . . a case
21 . . . a frame
24 . . . a cover
26 . . . a second housing (a connector housing)
26a . . . a hood
30F . . . a displacement restricting portion (interlocking portion)
30R . . . a displacement restricting portion (interlocking portion)
32 . . . a deformation restricting portion
33a . . . a displacement restricting portion (interlocking portion)
33b . . . a displacement restricting portion (interlocking portion)
33c . . . a displacement restricting portion (interlocking portion)
34 . . . a backward movement restricting portion

BEST MODES FOR CARRYING OUT THE INVENTION

Figure 2:
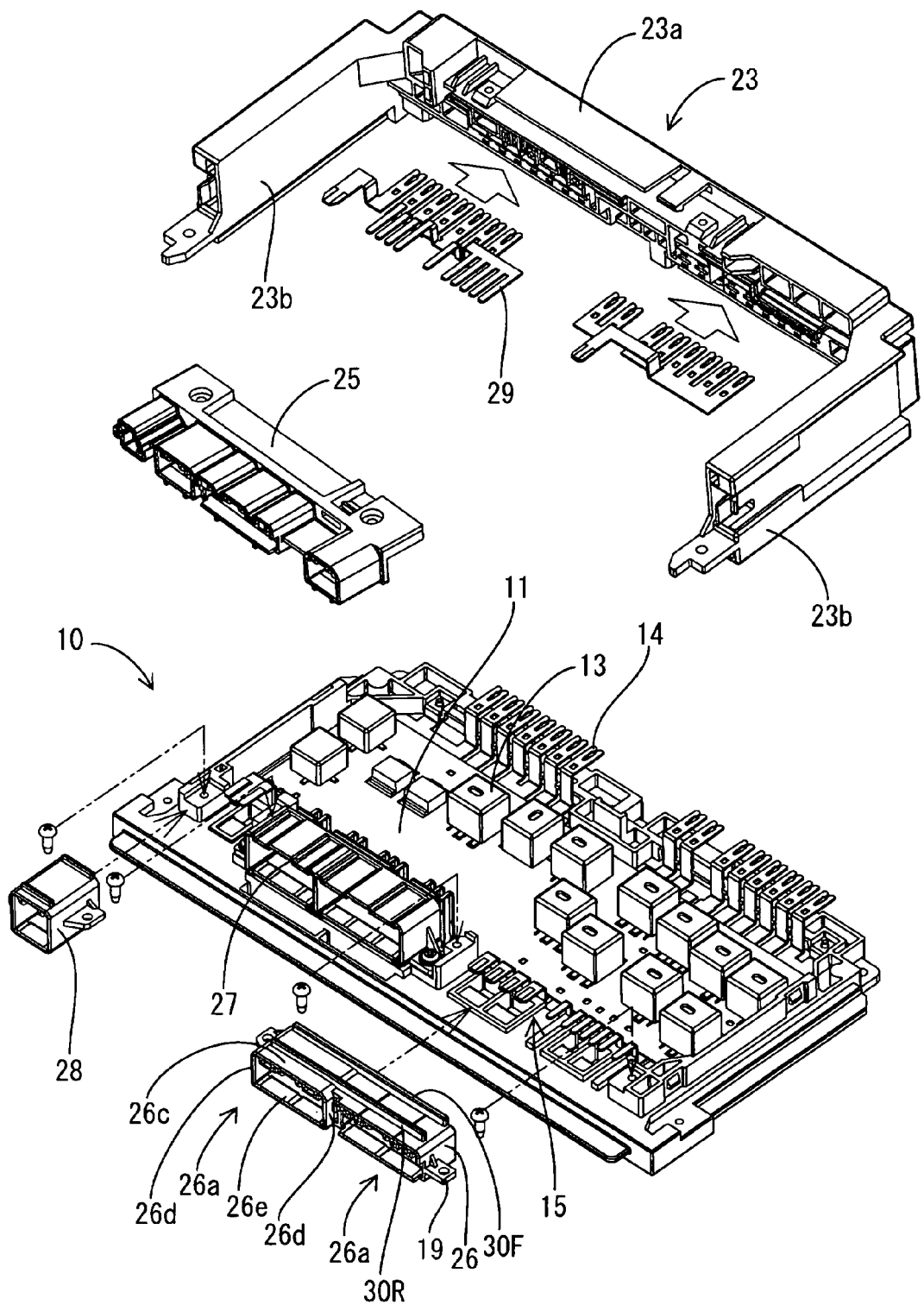
FIG. 2 is an exploded perspective view removing a cover.
Figure 3:
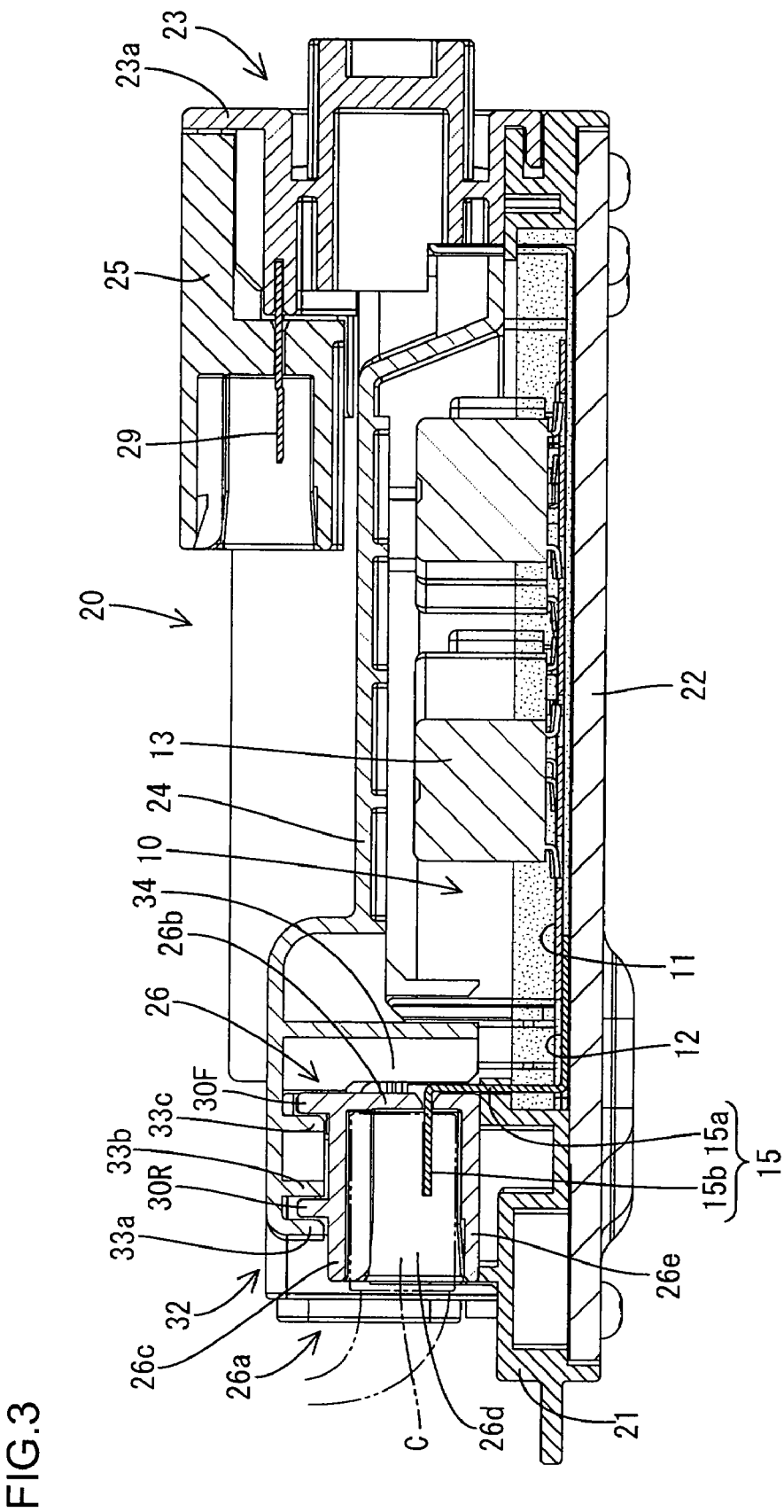
FIG. 3 is a cross-sectional view.
Figure 4:
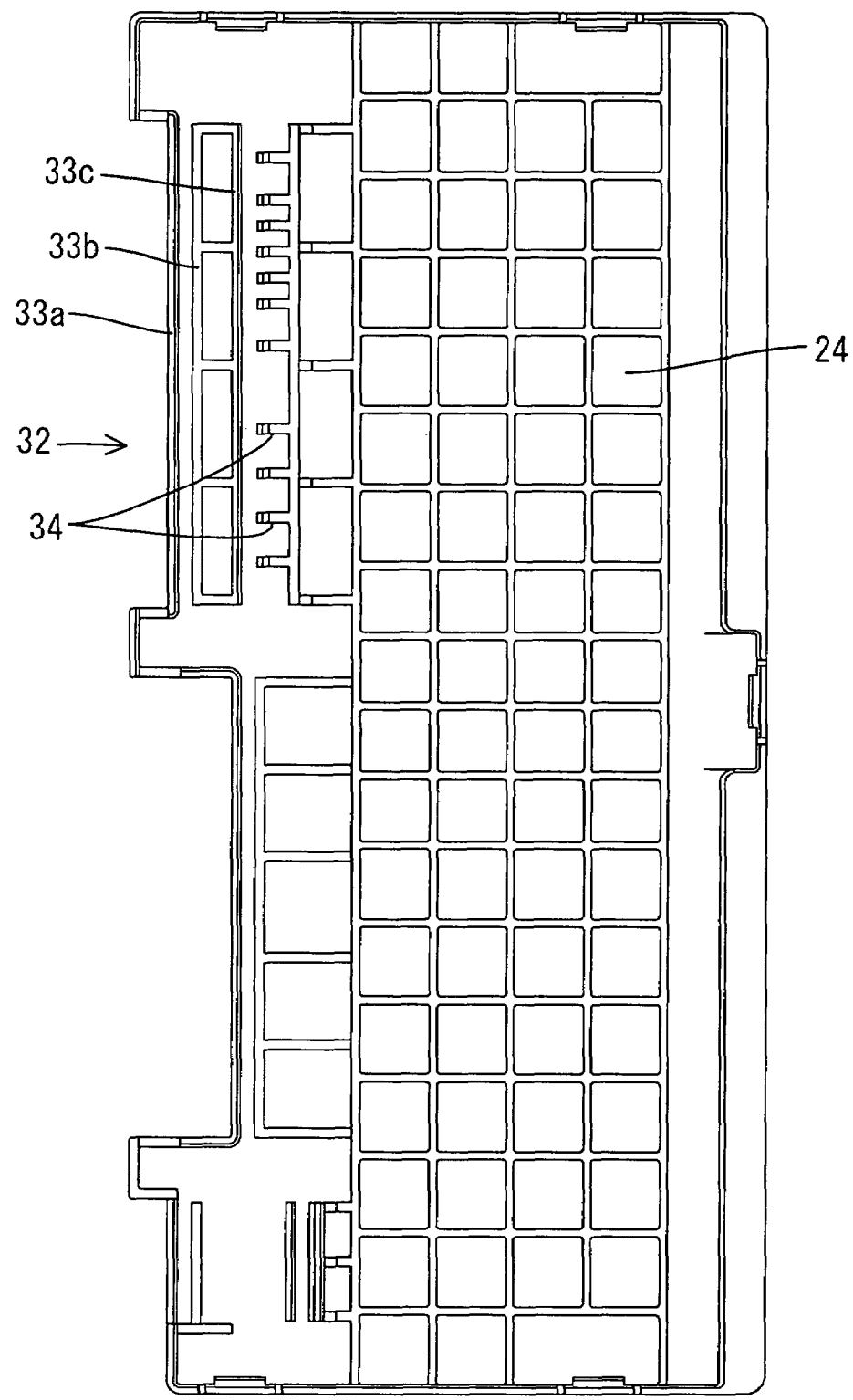
FIG. 4 is a bottom view of the cover.

An illustrative example, which embodies the present invention, is explained with reference to FIG. 1 through FIG. 4. In this illustrative example, an electric connection box is mounted in an automobile, positioned between a battery (not illustrated) and electrical equipment such as lamps, audio, and the like (not illustrated), and configured so as to distribute and supply the electric power supplied by the battery to each electrical equipment as well as perform control of the electric power supply by switching it on and off and so on. In FIG. 1 through FIG. 3, the electric connection box is drawn so that its obverse face is upwardly directed, but in its installed state in an automobile, the electric connection box is accommodated in a relay box (not illustrated) in an orientation such that a fuse block 23 is positioned on the top side and housings 25, 26, 27, and 28 open downward, and then the relay box is fixed in the automobile body (not illustrated).

The electric connection box includes a circuit structure 10 and a case 20 for accommodating the circuit structure 10.

The circuit structure 10 includes a circuit board 11, a plurality of bus bars 12 that are wired into the circuit along the reverse face (the lower face in FIG. 3) of the circuit board 11, and switching devices 13 (such as relays and semiconductor elements) that are mounted on the obverse face (the upper face side in FIG. 3) of the circuit board 11. The bus bars 12 are adhered on the reverse face of the circuit board 11, and the first terminals 14 formed at the edge of the bus bars 12 protrude from the front edge of the circuit board 11, and similarly, the second terminals 15 (the terminals that are ones of the features of the present invention) formed at the end of the bus bars 12 protrude from the rear end edge of the circuit board 11.

The second terminals 15 comprise supporting portions 15a (the portions of the second terminals 15 protruding from the back face of the hood 26a of the second connector housing) that extend substantially perpendicularly (upwardly) relative to the circuit board 11, and tab terminals 15b that extend backwardly from the upper ends of the supporting portions 15a (to the opposite direction from the circuit board 11) at a substantially right angle to the supporting portions 15a, and they are substantially L-shaped in a cross-sectional view. The other terminals, that is the first terminals 14, similar to the second terminals 15, are bent into substantially an L-shape.

The case 20 comprises a substantially square-shaped frame 21 made of insulating materials, such as synthetic resin, a metal heat sink 22 secured on the frame 21 so as to block up the reverse opening thereof, a fuse block 23 that is made of synthetic resin and is assembled to the front edge side of the frame 21, a cover 24 that is made of synthetic resin and is assembled to the frame 21 so as to block up the obverse opening (the opposite side of the heat sink 22) thereof, a first housing 25 that is made of synthetic resin and is assembled to the fuse block 23, and a second to fourth connector housings 26, 27, and 28 that are made of synthetic resin and are assembled to the rear edge portion of the frame 21.

The frame 21 is arranged so that it surrounds the entire circumference of the circuit assembly 10 continuously along the perimeter edge of the circuit board 11, and is secured on the obverse face of the heat sink by means of adhesive material (not illustrated). The plurality of second terminals 15 as described above are arranged such that they are lined up side by side along the rear edge portion of the frame 21.

The shape of the heat sink 22 is substantially similar to that of the circuit board 11, and the reverse face of the bus bars 12 is adhered to the obverse face of the heat sink 22 by means of adhesive material (not illustrated).

The fuse block 23 includes the long from side to side main body 23a, which is arranged along the front edge portion of the frame 21, and the pair of arm portions 23b, which extend backwardly from the left and right ends of the main body 23a in a cantilever fashion. The main body 23a is adapted so as to accommodate the ends of the first terminals 14, the substantially front halves of terminal fittings 29, and fuses (not illustrated) for connecting the first terminals 14 and the terminal fittings 29.

Out of the second-fourth connector housings 26, 27, 28 that are assembled to the rear edge portion of the frame 21, the second connector housing (that corresponds to the connector housing as one of the elements of the present invention) has a narrow and long block shape as a whole in the width direction thereof, and has two hoods that are aligned side by side and open backwardly. The assembly pieces 19, formed at left and right ends of the second connector housing, are secured on the obverse face of the rear edge portion of the frame 21 by screws, thereby the second connector housing is fixed on the obverse face of the frame 21 so as to be loaded thereon. The tab terminals 15b of the second terminals 15 as described above penetrate the back wall 26b of the second connector housing and is accommodated in the hoods 26a. Also, the supporting portions 15a of the second terminals 15 are disposed along the back face of the back wall 26b (the face opposite from the opening of the hoods 26a). The hoods 26a of the second connector housing are arranged so as to fit a harness side connector C from the back direction. Both the third connector housing 27 and the fourth connector housing 28 also, like the second connector housing does, have hood(s) that open(s) backwardly, and are secured on the frame 21 by screws.

Each hood 26a of the second connector housing consists of an upper wall 26c, right and left walls 26d, and a bottom wall 26e, and the bottom wall 26e abuts the obverse face (upper face) of the rear edge portion of the frame 21. The outer faces (the upper face) of the upper walls 26c of the hoods 26a are formed with a pair of front and rear displacement restricting portions 30F, 30R that extend linearly in the right and left direction (in the longitudinal direction of the rear edge portion of the frame 21). Each of the displacement restricting portions 30F, 30R protrudes in a rib-shape and is formed continuously along the whole width of the hood 26a. The front displacement restricting portion 30F is formed along the front edge of the hood 26a (the upper edge of the back wall 26b), while the rear displacement restricting portion 30R is disposed in vicinity of the rear end of the hood 26a a slight distance therefrom. The displacement restricting portions 30F, 30R perform also as interlocking portions in the present invention.

The whole shape of the cover 24 is substantially similar to that of the circuit board 11, but is a larger size than that of the circuit board 11. The cover 24 is assembled to the frame 21 from the obverse face side thereof, and, in its assembled state thereon, the circuit board 11 and the switching devices 13 accommodated in the frame 21 are covered with the cover 24.

Out of the rear edge portion of the cover 24, the portion that corresponds to the hoods 26a of the second connector housing is a deformation restricting portion 32 that abuts the hoods 26a so as to cover it from the upper face direction thereof. The deformation restricting portion 32 is formed in a plate shape, and formed with three displacement restricting portions 33a, 33b, and 33c in the front and back arrangement and extending linearly in a direction from left to right (the direction along the longitudinal direction of the rear edge portion of the frame 21 and the rear edge portion of the cover 24) on the lower face (the face opposing the hoods 26a) of the deformation restricting portion 32. Each of the first to third displacement restricting portion 33a, 33b, and 33c is formed so as to protrude in a rib-shape and extensively in the whole width of the area facing the hoods 26a (in a direction of from left to right). The first displacement restricting portion 33a, which is the most rear one, is disposed along the rear end edge of the cover 24, while the second displacement restricting portion 33b, which is the central one, is disposed slightly forward from the first displacement restricting portion 33a. The displacement restricting portions 33a, 33b, and 33c, also act as interlocking portions in the present invention.

Also, the lower face of the deformation restricting portion 32 is formed with a plurality of backward movement restricting portions 34 extending downward from the position forward from the third displacement restricting portion 33c and are aligned in left and right direction along the rear edge portion of the cover 24. The front end edge portion of each backward movement restricting portion 34 is disposed so as to abut the supporting portions 15a of the second terminals 15 from the front direction (from the opposite side of the opening of the hood 26a). The front end edge portions of the backward movement restricting portions 34 are step-shaped, and the upper end side portions (the end portions of the side closer to the deformation restricting portion 32) of the front end edge portions of the backward movement restricting portions 34 that do not face the supporting portions 15a are disposed so as to abut the back faces (front faces) of the hoods 26a from the front direction.

Next, the effect of the present illustrative example is described.

It is a concern that the upper walls 26c of the hoods 26a may deform by expanding upward (outward) when the harness side connector C connected to the hoods 26a inclines upward or downward in the directions according to FIG. 3. However, in the present illustrative example, the first to the third displacement restricting portions 33a, 33b, and 33c formed on the deformation restricting portion 32 abut the upper walls 26c of the hoods 26a from the upper direction, and therefore, the upward deformation of the upper walls 26c of the hoods 26a does not occur.

In addition, the first displacement restricting portion 33a and the second displacement restricting portion 33b of the cover 24 engage (interlock with) the rear side displacement restricting portion 30R of the hoods 26a so as to hold it from the front and rear sides thereof, while the third displacement restricting portion 33c and the backward movement restricting portions 34 of the cover 24 engage (interlock with) the front side displacement restricting portion 30F of the hoods 26a so as to hold it from the front and rear sides thereof. These engagements (interlocking) prevent the rear edge portion of the cover 24 from displacement relatively toward or away from the frame 21 and the second connector housing. Thus, displacement of the deformation restricting portion 32 (the first to the third displacement restricting portions 33a, 33b, and 33c) relative to the hood 26a does not occur, and deformation of the hood 26a is reliably prevented.

Also, the backward movement restricting portion 34 abuts the supporting portions 15a of the second terminals 15 from behind thereof, thereby displacement to the back face side direction (frontward) of the second terminals 15 relative to the hoods 26a and the rear edge portion of the cover 24 is restricted. In addition, frontward (to the back face side direction) displacement of the cover 24 relative to the second connector housing is restricted. Thus, backward movement of the second terminals 15 (by way of the backward movement restricting portion 34) is reliably restricted.

Also, since the second connector housing is a separate member from the frame 21 in the present illustrative example, it is a concern that the second connector housing may pivot about the screwed points anteroposteriorly (upward and downward) relative to the frame 21. However, since the hoods 26a (the second connector housing) are sandwiched in up and down directions between the deformation restricting portion 32 of the cover 24 and the frame 21, inclination of the second connector housing is prevented.

ANOTHER ILLUSTRATIVE EXAMPLE

The scope of the present invention is not limited to the illustrative examples explained by the above descriptions and drawings above. For example, the illustrative examples listed below are included within the technical scope of the present invention.

(1) In the above-described illustrative example, the housings are separate members from the frame, but in accordance with the present invention, the housings may be integrally formed with the frame.

(2) In the above-described illustrative example, the displacement restricting portions are formed so as to restrict the displacement of the second terminals in the extending direction thereof, but it also may be formed so as to restrict the displacement in the perpendicular direction to the extending direction thereof. Alternatively, for example, a structure having a plurality of pins are arranged on the outer face of the hoods, whereby the pins engage with respective engaging holes disposed on the deformation restricting portion that abuts the outer face of the hoods, can be used to thereby restrict displacement in any direction.

(3) In the above-described illustrative example, the displacement restricting portions are rib-shaped, but in accordance with the present invention, they may be channel-shaped.

The invention claimed is:

1. An electric connection box comprising:
   a circuit structure having a circuit board, the circuit board having a switching device mounted thereon and a bus bar layered on the circuit board;
   a case for accommodating the circuit structure, the case having a frame that is disposed and secured in position around the perimeter edge of the circuit board and a cover that is assembled to the frame so as to cover the circuit board;
   a terminal formed at the end of the bus bar;
   a connector housing mounted on the frame and having a hood for accommodating the terminal; and
   a deformation restricting portion that is formed on the cover so as to abut the outer face of the hood, thereby restricting deformation of the hood.

2. The electric connection box according to claim 1, wherein each of the hood and the deformation restricting portion includes a displacement restricting portion, that engage each other and thereby restrict displacement of the deformation restricting portion relative to the hood to the direction crossing to the abutting direction.

3. The electric connection box according to claim 2, wherein the displacement restricting portion includes a first rib formed on the outer face of the hood that protrudes and extends perpendicular to an extending direction of the terminal and a second rib formed on the deformation restricting portion of the cover so as to protrude and extend to the same direction as the direction the first rib extends.

4. The electric connection box according to claim 1, wherein the cover further includes a backward movement restricting portion that abuts the portion of the terminal protruding from the back face side of the hood for restricting backward displacement of the terminal to the back direction.

5. The electric connection box according to claim 4, wherein the cover and the hood includes interlocking portions that engage each other for restricting displacement of the cover relative to the hood to the back direction.

6. The electric connection box according to claim 1, being characterized in that the connector housing is a separate member from the frame and the hood is held between the deformation restricting portion and the frame.

7. The electric connection box according to claim 6, wherein each of the hood and the deformation restricting portion includes a displacement restricting portion that engage each other and thereby restrict displacement of the deformation restricting portion relative to the hood to the direction crossing to the abutting direction.

8. The electric connection box according to claim 7, wherein the displacement restricting portion includes a first rib formed on the outer face of the hood so as to protrude and extend perpendicular to an extending direction of the terminal and a second rib formed on the deformation restricting portion of the cover so as to protrude and extend to the same direction as the direction the first rib extends.

* * * * *